(12) United States Patent
Okawa

(10) Patent No.: US 10,186,591 B2
(45) Date of Patent: Jan. 22, 2019

(54) NITRIDE SEMICONDUCTOR DEVICE

(71) Applicant: TOYOTA JIDOSHA KABUSHIKI KAISHA, Toyota-shi, Aichi-ken (JP)

(72) Inventor: Takashi Okawa, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/149,528

(22) Filed: May 9, 2016

(65) Prior Publication Data
US 2016/0380091 A1    Dec. 29, 2016

(30) Foreign Application Priority Data
Jun. 26, 2015   (JP) .................. 2015-129137

(51) Int. Cl.
| | |
|---|---|
| H01L 29/45 | (2006.01) |
| H01L 29/47 | (2006.01) |
| H01L 29/778 | (2006.01) |
| H01L 29/10 | (2006.01) |
| H01L 29/423 | (2006.01) |
| H01L 29/06 | (2006.01) |
| H01L 29/20 | (2006.01) |

(52) U.S. Cl.
CPC ........ H01L 29/452 (2013.01); H01L 29/1066 (2013.01); H01L 29/475 (2013.01); H01L 29/7786 (2013.01); H01L 29/7788 (2013.01); H01L 29/0646 (2013.01); H01L 29/2003 (2013.01); H01L 29/42316 (2013.01)

(58) Field of Classification Search
CPC .................................................. H01L 29/452
USPC .................................................. 257/190–196
See application file for complete search history.

(56) References Cited

U.S. PATENT DOCUMENTS

| | | | |
|---|---|---|---|
| 2003/0098462 A1* | 5/2003 | Yoshida | H01L 21/28575 257/183 |
| 2005/0173728 A1 | 8/2005 | Saxler | |
| 2007/0108547 A1* | 5/2007 | Zhu | H01L 21/28581 257/471 |
| 2007/0278521 A1 | 12/2007 | Ishida et al. | |

(Continued)

FOREIGN PATENT DOCUMENTS

| | | |
|---|---|---|
| DE | 10 2011 000 911 A1 | 9/2011 |
| JP | 2007-329205 A | 12/2007 |

(Continued)

*Primary Examiner* — Ori Nadav
*Assistant Examiner* — Vernon P Webb
(74) *Attorney, Agent, or Firm* — Oliff PLC (57) ABSTRACT

A nitride semiconductor device includes: a first nitride semiconductor layer; a second nitride semiconductor layer located on the first nitride semiconductor layer and having a band gap larger than a band gap of the first nitride semiconductor layer; a p-type semiconductor layer located on the second nitride semiconductor layer; and a gate electrode located on the p-type semiconductor layer. A first interface and a second interface are located in parallel between the gate electrode and the p-type semiconductor layer. The first interface has a first barrier with respect to holes moving in a direction from the p-type semiconductor layer to the gate electrode. The second interface has a second barrier with respect to the holes moving in a direction from the p-type semiconductor layer to the gate electrode. The second barrier is higher than the first barrier.

7 Claims, 9 Drawing Sheets

(56) References Cited

U.S. PATENT DOCUMENTS

| | | | |
|---|---|---|---|
| 2008/0308838 A1* | 12/2008 | McNutt | H01L 21/8232 257/133 |
| 2011/0210377 A1 | 9/2011 | Haeberlen et al. | |
| 2012/0267686 A1 | 10/2012 | Jeon et al. | |
| 2013/0082276 A1 | 4/2013 | Park et al. | |
| 2014/0159117 A1 | 6/2014 | Taniguchi et al. | |
| 2016/0035847 A1 | 2/2016 | Cao et al. | |

FOREIGN PATENT DOCUMENTS

| | | |
|---|---|---|
| JP | 2012-231109 A | 11/2012 |
| JP | 2013-080894 A | 5/2013 |
| JP | 2013-153185 A | 8/2013 |
| JP | 2014-116401 A | 6/2014 |
| TW | 2005-27674 A | 8/2005 |
| TW | 2015-13341 A | 4/2015 |

* cited by examiner

FIG. 17

NITRIDE SEMICONDUCTOR DEVICE

CROSS-REFERENCE TO RELATED APPLICATION

This application claims priority to Japanese Patent Application No. 2015-129137 filed on Jun. 26, 2015, the entire contents of which are hereby incorporated by reference into the present application.

TECHNICAL FIELD

The technology disclosed herein relates to a nitride semiconductor device.

DESCRIPTION OF RELATED ART

Japanese Patent Application Publication No. 2013-80894 A discloses a HEMT (high electron mobility transistor) as a nitride semiconductor device. This HEMT is a normally-off HEMI whose gate threshold voltage is higher than 0 V. This HEMT includes a first nitride semiconductor layer and a second nitride semiconductor layer located on the first nitride semiconductor layer. A band gap of the second nitride semiconductor layer is larger than a band gap of the first nitride semiconductor layer. A hetero junction is provided at an interface between the first nitride semiconductor layer and the second nitride semiconductor layer. A source electrode and a drain electrode are located on the second nitride semiconductor layer. Further, a p-type semiconductor layer, an n-type semiconductor layer, and a gate electrode are stacked on a portion of the second nitride semiconductor layer located between the source electrode and the drain electrode. In this HEMT, a two-dimensional electron gas (hereinafter referred to as a "2DEG") is provided along the hetero junction at the interface between the first nitride semiconductor layer and the second nitride semiconductor layer. Note, however, that in a state where a gate voltage is lower than the gate threshold voltage, a depletion layer extends from the p-type semiconductor layer into the second nitride semiconductor layer. This depletion layer may be hereinafter referred to as a "first depletion layer". In the state where the gate voltage is lower than the gate threshold voltage, the first depletion layer reaches as far as the hereto junction. For this reason, the first depletion layer separates the 2DEG into a source electrode side and a drain electrode side so that no 2DEG is provided at a portion of the hetero junction located directly below the p-type semiconductor layer. For this reason, in the state where the gate voltage is lower than the gate threshold voltage, no current flows through the HEMT even when a voltage is applied between the source electrode and the drain electrode. Raising the gate voltage causes a potential of the p-type semiconductor layer to rise as the gate voltage rises, thus causing the first depletion layer to shrink toward the p-type semiconductor layer. When this causes the first depletion layer to separate from the hetero junction, the 2DEG is formed at the portion of the hetero junction located directly below the p-type semiconductor layer. This brings about a state in which the 2DEG is provided in the whole area of the hetero junction. This allows a current to flow between the source electrode and the drain electrode. That is, the HEMT is turned on. Further, raising the gate voltage as described above causes a depletion layer to spread from a p-n junction at an interface between the p-type semiconductor layer and the n-type semiconductor layer to an area around the p-n junction. This depletion layer may be hereinafter referred to as a "second depletion layer". Thus, the semiconductor device of Japanese Patent Application Publication No. 2013-80894 A can suppress a gate-leakage current, as the second depletion layer spreads to the p-type semiconductor layer and the n-type semiconductor layer when the gate voltage is raised.

As mentioned above, in the HEMT of Japanese Patent Application Publication No. 2013-80894 A, the second depletion layer spreads to the area around the p-n junction at the interface between the p-type semiconductor layer and the n-type semiconductor layer when the gate voltage is high. In this state, the p-type semiconductor layer is electrically separated from the gate electrode by the second depletion layer. This causes the potential of the p-type semiconductor layer to be floating. When the HEMT is turned off, the gate voltage is lowered from a voltage of this state to a voltage that is lower than the gate threshold voltage. Then, first, the second depletion layer located around the p-n junction shrinks. In the presence of the second depletion layer, there is hardly a drop in the potential of the p-type semiconductor layer. When the gate voltage drops, the second depletion layer is shrunk to such an extent that the presence of the second depletion layer can be ignored. Hereinafter, when a depletion layer is shrunk to such an extent that the present of the depletion layer can be ignored, the depletion layer is said to disappear. When the second depletion layer disappears, the p-type semiconductor layer is electrically connected to the gate electrode. Therefore, at this stage, the potential of the p-type semiconductor layer starts to drop. As the potential of the p-type semiconductor layer drops, the first depletion layer extends from the p-type semiconductor layer into the second nitride semiconductor layer. When the first depletion layer reaches the hetero junction, a portion of the 2DEG located directly below the p-type semiconductor layer disappears. This causes the HEMT to be turned off. As described above, when the HEMT of Japanese Patent Application Publication No. 2013-80894 A is turned off, there is hardly a drop in the potential of the p-type semiconductor layer until the second depletion layer disappears. This delays the timing of disappearance of the portion of the 2DEG located directly below the p-type semiconductor layer. For this reason, the HEMT of Japanese Patent Application Publication No. 2013-80894 A has had a problem with a low response speed when it is turned off. Therefore, the present disclosure provides a normally-off nitride semiconductor device that is capable of suppressing a gate-leakage current and that has a high response speed when it is turned off.

BRIEF SUMMARY

A nitride semiconductor device disclosed herein comprises: a first nitride semiconductor layer; a second nitride semiconductor layer located on the first nitride semiconductor layer and having a band gap larger than a band gap of the first nitride semiconductor layer; a p-type semiconductor layer located on the second nitride semiconductor layer; and a gate electrode located on the p-type semiconductor layer. A first interface and a second interface are located in parallel between the gate electrode and the p-type semiconductor layer. The first interface has a first barrier with respect to holes moving in a direction from the p-type semiconductor layer to the gate electrode. The second interface has a second barrier with respect to the holes moving in a direction from the p-type semiconductor layer to the gate electrode. The second barrier is higher than the first barrier.

It should be noted that the statement that "a first interface and a second interface are located in parallel" means that the first interface and the second interface are located so that holes flowing from the p-type semiconductor layer toward the gate electrode pass through either the first interface or the second interface. Further, the terms "first barrier" and "second barrier" mean barriers when the gate voltage is equal to a predetermined fixed voltage (e.g., 0 V).

In this nitride semiconductor device, the first depletion layer spreads from the p-type semiconductor layer to the second nitride semiconductor layer in a case where the gate voltage is lower than the gate threshold voltage. By the depletion layer reaching the hetero junction (i.e., the interface between the first nitride semiconductor layer and the second nitride semiconductor layer), the nitride semiconductor device is turned off. By the first depletion layer extending from the p-type semiconductor layer to the second nitride semiconductor layer, the normally-off nitride semiconductor device is achieved. In a case where this nitride semiconductor device is turned on, the gate voltage is raised to a voltage that is equal to or higher than the gate threshold voltage. Raising the gate voltage to a voltage that is equal to or higher than the gate threshold voltage causes the potential of the p-type semiconductor layer to rise, thus causing the first depletion layer to retreat from the hetero junction. This causes the nitride semiconductor device to be turned on. Further, raising the gate voltage causes a voltage to be applied to the second interface, whose barrier is larger, in such a direction as to enlarge the barrier. This causes a depletion layer to spread from the second interface to a portion of the p-type semiconductor layer located around the second interface. This depletion layer may be hereinafter referred to as a "third depletion layer". On the other hand, no depletion layer spreads from the first interface, whose barrier is smaller. However, the third depletion layer, which spreads from the second interface, extends to a portion of the p-type semiconductor layer located near the first interface. Since the third depletion layer thus spreads to not only the area around the second interface but also a vicinity of the first interface, a gate-leakage current (i.e., a current that flows from the gate electrode to the p-type semiconductor layer) can be suppressed. In a case where the nitride semiconductor device is turned off, the gate voltage is lowered to a voltage that is lower than the gate threshold voltage. This causes a portion of the third depletion layer located within the p-type semiconductor layer to shrink toward the second interface. Since the third depletion layer shrinks toward the second interface, the third depletion layer retreats from the vicinity of the first interface. As a result, the p-type semiconductor layer is connected to the gate electrode via the first interface, and the potential of the p-type semiconductor layer drops. That is, at a stage earlier than the disappearance of the third depletion layer from the p-type semiconductor layer, the potential of the p-type semiconductor layer starts to drop. The drop in the potential of the p-type semiconductor layer causes the first depletion layer to extend from the p-type semiconductor layer to the second nitride semiconductor layer. When the first depletion layer reaches the hetero junction, the nitride semiconductor device is turned off. Thus, this structure causes the potential of the p-type semiconductor layer to start to drop at an earlier stage when the nitride semiconductor device is turned off. Therefore, this nitride semiconductor device has a high response speed when it is turned off. As described above, this structure makes it possible to achieve a normally-off nitride semiconductor device that is capable of suppressing a gate-leakage current and that has a high response speed when it is turned off.

DETAILED DESCRIPTION

Embodiment 1

Figure 1:
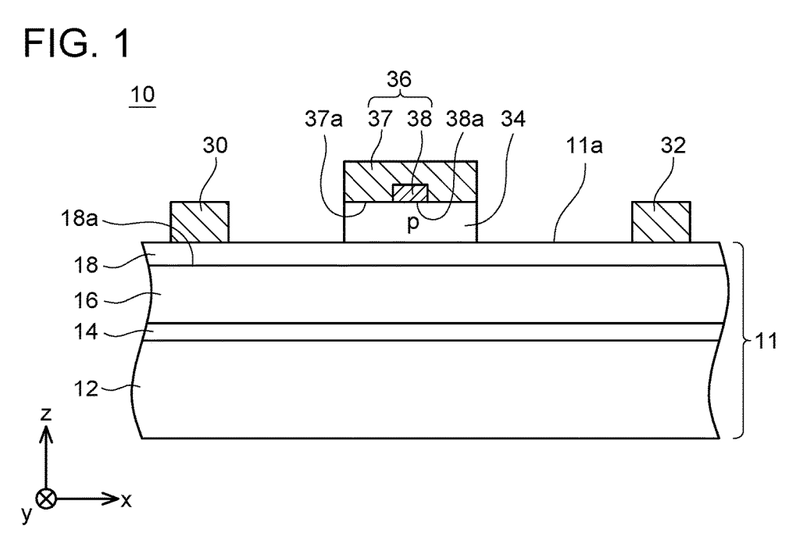
FIG. 1 is a longitudinal sectional view of a HEMT 10 according to Embodiment 1.

A HEMT 10 according to an embodiment shown in FIG. 1 includes a multilayer substrate 11. The multilayer substrate 11 has a structure in which a base substrate 12, a buffer layer 14, an electron transit layer 16, and an electron supply layer 18 are stacked. It should be noted that a thickness direction of the multilayer substrate 11 will be hereinafter referred to as "z direction", that a direction (horizontal direction in FIG. 1) orthogonal to the z direction will be hereinafter referred to as "x direction", and that a direction orthogonal to the x direction and the z direction will be hereinafter referred to as "y direction".

The base substrate 12 is made of silicon. Alternatively, the base substrate 12 may be made of a material (such as sapphire, SiC, or GaN) that enables crystal growth of a nitride semiconductor layer on a front surface of the base substrate 12.

The buffer layer 14 is located on the base substrate 12. The buffer layer 14 is made of GaN. Alternatively, the buffer layer 14 may be made of a material such as AlGaN or AlN.

The electron transit layer 16 is located on the buffer layer 14. The electron transit layer 16 is made of i-type (i.e., undoped) GaN.

The electron supply layer 18 is located on the electron transit layer 16. The electron supply layer 18 is made of i-type InAlGaN. More specifically, the electron supply layer 18 is made of $In_{x1}Al_{y1}Ga_{1-x1-y1}N$ (0≤x1≤1, 0<y1≤1, 0≤1−x1−y1≤1). A band gap of the electron supply layer 18 is larger than a hand gap of the electron transit layer 16. A hetero junction 18a is provided at an interface between the electron supply layer 18 (i.e., InAlGaN) and the electron transit layer 16 (i.e., GaN). A 2DEG (two-dimensional electron gas) is provided in a portion of the electron transit layer 16 located near the hetero junction 18a.

A source electrode 30, a drain electrode 32, a p-type gate layer 34, and a gate electrode 36 are provided on the multilayer substrate 11.

Figure 2:
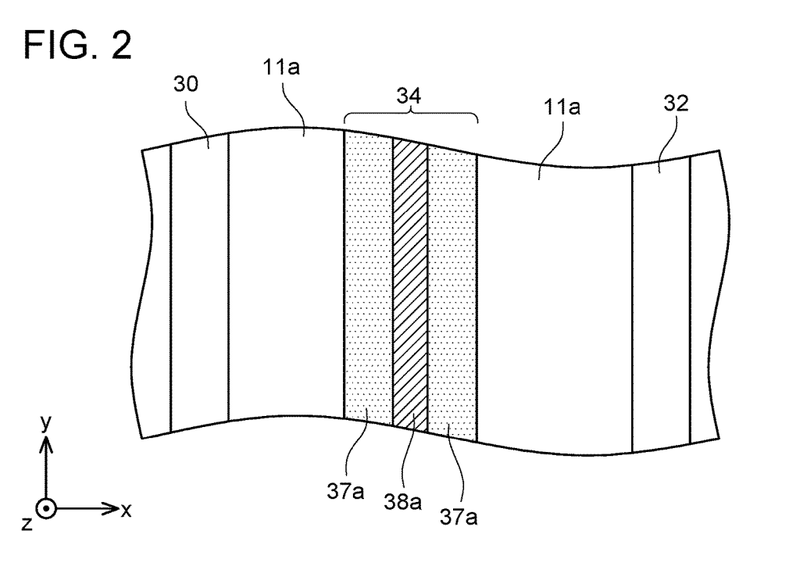
FIG. 2 is a plan view of the HEMT 10 according to Embodiment 1 (but omits to illustrate a gate electrode 36 and shows an arrangement of interfaces 37a and 38a)

The source electrode 30 is located on the electron supply layer 18. The source electrode 30 is a laminated electrode of Ti and Al. Ti is in contact with the electron supply layer 18, and Al is stacked on Ti. The source electrode 30 is in ohmic contact with the electron supply layer 18. As shown in FIG. 2, the source electrode 30 stretches in the y direction.

As shown in FIG. 1, the drain electrode 32 is located on the electron supply layer 18. The drain electrode 32 is located in a position away from the source electrode 30 in the x direction. The drain electrode 32 is a laminated electrode of Ti and Al. Ti is in contact with the electron supply layer 18, and Al is stacked on Ti. The drain electrode 32 is in ohmic contact with the electron supply layer 18. As shown in FIG. 2, the drain electrode 32 stretches in the y direction.

As shown in FIG. 1, the p-type gate layer 34 is located on the electron supply layer 18. The p-type gate layer 34 is in contact with the electron supply layer 18. The p-type gate layer 34 is located between the source electrode 30 and the drain electrode 32. More specifically, as shown in FIG. 2, in a plan view of a front surface 11a of the multilayer substrate 11 (i.e., a front surface of the electron supply layer 18), the p-type gate layer 34 is located within an area between the source electrode 30 and the drain electrode 32. The p-type gate layer 34 stretches in the y direction. The p-type gate layer 34 is made of p-type GaN. Alternatively, the p-type gate layer 34 may be made of a p-type semiconductor such as p-type AlGaN.

The gate electrode 36 is located on the p-type gate layer 34. The gate electrode 36 includes a Schottky electrode portion 37 and an ohmic electrode portion 38.

The ohmic electrode portion 38 is made of Pt, Pb, an alloy thereof, or the like. The ohmic electrode portion 38 is in contact with a front surface of the p-type gate layer 34 substantially in a central part of the p-type gate layer 34 in a width direction (i.e., the x direction). The ohmic electrode portion 38 is in ohmic contact with the p-type gate layer 34. An interface between the ohmic electrode portion 38 and the p-type gate layer 34 will be hereinafter referred to as "ohmic interface 38a". The ohmic interface 38a is indicated by a hatched region in FIG. 2. As shown in FIG. 2, the ohmic interface 38a stretches in the y direction.

The Schottky electrode portion 37 is made of Ni, W, Ti, Al, an alloy thereof, or the like. The Schottky electrode portion 37 covers the p-type gate layer 34 and the ohmic electrode portion 38. The Schottky electrode portion 37 is in contact with the ohmic electrode portion 38. Further, the Schottky electrode portion 37 is in Schottky contact with the front surface of the p-type gate layer 34 in an area where the ohmic electrode portion 38 is not provided. Interfaces between the Schottky electrode portion 37 and the p-type gate layer 34 will be referred to as "Schottky interfaces 37a". The Schottky interfaces 37a are indicated by dotted regions in FIG. 2. As shown in FIG. 2, such Schottky interfaces 37a are provided at both sides, respectively, of the ohmic interface 38a in the x direction. Each of these Schottky interfaces 37a is adjacent to the ohmic interface 38a. Each of these Schottky interfaces 37a stretches in the y direction.

The following will describe the characteristics of the ohmic interface 38a and the Schottky interfaces 37a. In a state where a gate voltage is 0 V, each of the Schottky interfaces 37a has a barrier with respect to holes moving in a direction from the p-type gate layer 34 to the gate electrode 36. When a potential of the gate electrode 36 becomes lower than a potential of the p-type gate layer 34, the barrier of each of the Schottky interfaces 37a becomes smaller. When the potential of the gate electrode 36 becomes lower than the potential of the p-type gate layer 34 by a predetermined value or larger, the barrier becomes so small that holes flow from the p-type gate layer 34 toward the gate electrode 36 via the Schottky interfaces 37a. On the other hand, such a barrier of the ohmic interface 38a is extremely small (almost zero). Therefore, when the potential of the gate electrode 36 becomes lower than the potential of the p-type gate layer 34, holes flow from the p-type gate layer 34 toward the gate electrode 36 via the ohmic interface 38a. That is, in the state where the gate voltage is 0 V, each of the Schottky interfaces 37a has a higher barrier with respect to the holes moving in a direction from the p-type gate layer 34 to the gate electrode 36 than the ohmic interface 38a does.

Figure 4:
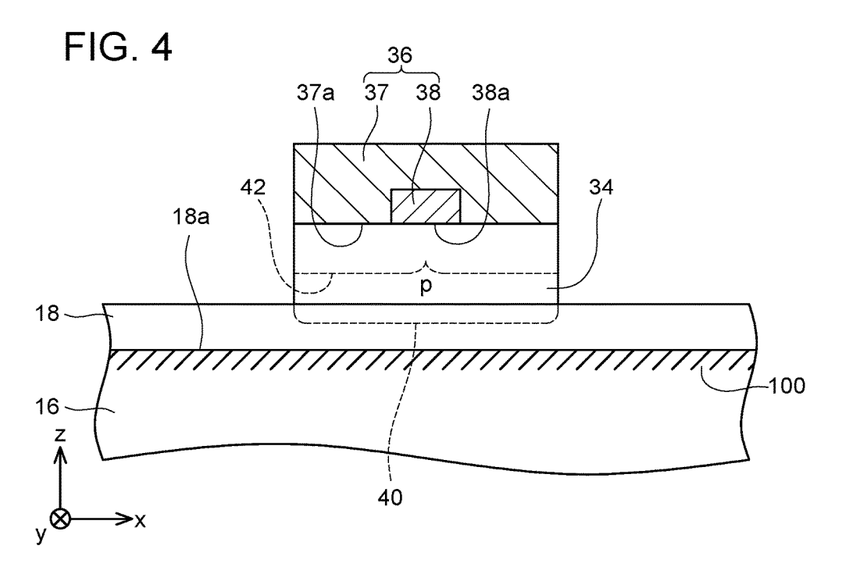
FIG. 4 is an enlarged cross-sectional view of the gate and the area therearound of the HEMT 10 according to Embodiment 1.
Figure 5:
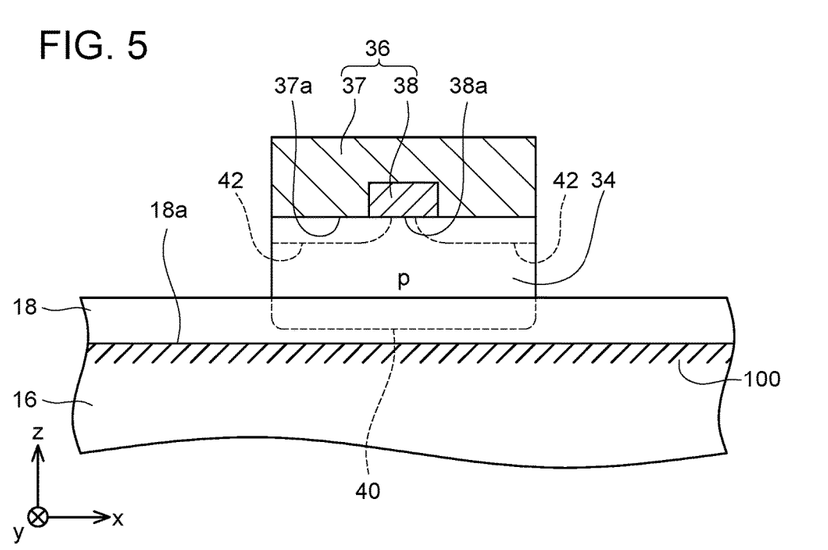
FIG. 5 is an enlarged cross-sectional view of the gate and the area therearound of the HEMT 10 according to Embodiment 1.

When the potential of the gate electrode 36 is higher than the potential of the p-type gate layer 34, a depletion layer 42 spreads from the aforementioned high-barrier Schottky interfaces 37a into the p-type gate layer 34 as shown in FIGS. 4 and 5. On the other hand, even when the potential of the gate electrode 36 is higher than the potential of the p-type gate layer 34, no depletion layer spreads from the aforementioned low-barrier ohmic interface 38a to the p-type gate layer 34.

As mentioned above, the depletion layer 42 spreads from the Schottky interfaces 37a into the p-type gate layer 34 when the potential of the gate electrode 36 is higher than the potential of the p-type gate layer 34. At this point in time, a distance L (m) that the depletion layer 42 spreads (i.e., a distance L from each Schottky interface 37a), a dielectric constant $\in_s$ (Fm$^{-1}$) of the p-type gate layer 34, a built-in potential Vbi (V) of the Schottky interfaces 37a, a gate voltage Vg (V), an elementary electric charge q (C), and a p-type impurity density Na (m$^{-3}$) in the p-type gate layer 34 satisfy the formula:

$$L = \sqrt{\frac{2\varepsilon_s(Vbi+Vg)}{qNa}}$$

It should be noted that the gate voltage Vg is a potential of the gate electrode 36 with respect to the source electrode 30. Substituting a gate threshold voltage Vgth as the gate voltage Vg in the aforementioned formula yields a distance L2 that the depletion layer extends while the gate threshold voltage Vgth is being applied. That is, the distance L2 satisfies the formula:

$$L2 = \sqrt{\frac{2\varepsilon_s(Vbi + Vgth)}{qNa}}$$

Figure 3:
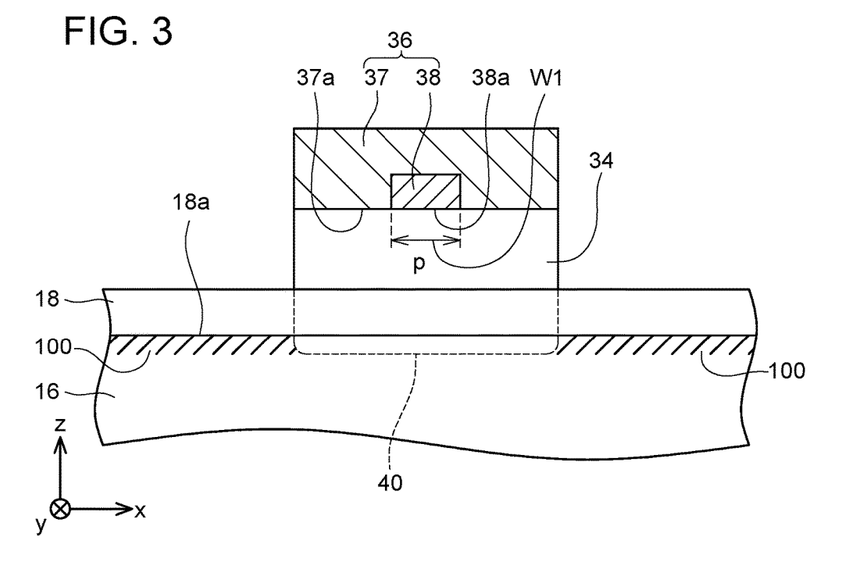
FIG. 3 is an enlarged cross-sectional view of a gate and an area therearound of the HEMT 10 according to Embodiment 1.

Further, FIG. 3 shows a width W1, which indicates the width of the ohmic interface 38a in the x direction. In Embodiment 1, a half value W½ of the width W1 is smaller than the aforementioned distance L2. That is, entirety of the ohmic interface 38a is positioned within a range of the distance L2 from one of the Schottky interfaces 37a. Therefore, as shown in FIG. 4, when a gate voltage that is equal to or higher than the gate threshold voltage Vgth is applied, the depletion layer 42 spreads throughout a portion of the p-type gate layer 34 that is in contact with the ohmic electrode portion 38.

The following will describe operation of the HEMT 10. During use of the HEMT 10, such a voltage is applied between the source electrode 30 and the drain electrode 32 that the drain electrode 32 becomes positive. The gate threshold voltage Vgth of the HEMT 10 is higher than 0 V. FIG. 3 shows a state in which a gate-off voltage Vg0 (e.g., 0 V) that is lower than the gate threshold voltage Vgth is being applied as the gate voltage. In the state where the gate-off voltage Vg0 is being applied, a depletion layer 40 spreads from the p-type gate layer 34 to a portion of the electron supply layer 18 located below the p-type gate layer 34. A lower end of the depletion layer 40 reaches the hetero junction 18a. For this reason, in this state, no 2DEG is provided at a portion of the hetero junction 18a located directly below the p-type gate layer 34. The depletion layer 40 separates a 2DEG 100 into a source electrode 30 side and a drain electrode 32 side. In this state, no current flows even when a voltage is applied between the source electrode 30 and the drain electrode 32. That is, the HEMT 10 is off. As such, the HEMT 10 is of a normally-off type. It should be noted that the depletion layer does not spread into the p-type gate layer 34 in the state where the gate-off voltage Vg0 is being applied (that is, the depletion layer is shrunk to such an extent that the presence of the depletion layer can be ignored).

The following will describe an operation for turning on the HEMT 10. When the HEMT 10 is turned on, the gate voltage is raised from the gate-off voltage Vg0 to a gate-on voltage Vg1 (i.e., a voltage that is higher than the gate threshold voltage Vgth). Then, as shown in FIG. 4, the depletion layer 40 retreats toward the p-type gate layer 34, and the 2DEG 100 is formed at the portion of the hetero junction 18a located directly below the p-type gate layer 34. That is, this brings about a state in which the 2DEG 100 is provided all over the hetero junction 18a. This allows electrons to flow from the source electrode 30 toward the drain electrode 32 through the 2DEG 100. That is, the HEMT is turned on.

Further, raising the gate voltage to the gate-on voltage Vg1 causes a reverse voltage (i.e., a voltage that is applied in such a direction that holes do no flow) to be applied to the Schottky interfaces 37a. This causes the depletion layer 42 to spread from the Schottky interfaces 37a into the p-type gate layer 34 as shown in FIG. 4. At this point in time, the distance L that the depletion layer 42 extends from each Schottky interface 37a is longer than the aforementioned distance L2. That is, the distance L that the depletion layer 42 extends is longer than the aforementioned distance W½. Therefore, as shown in FIG. 4, the depletion layer 42, which extends from the Schottky interfaces 37a, depletes an entirety of a portion of the p-type gate layer 34 that constitutes the ohmic interface 38a. This causes the gate electrode 36 to be electrically isolated from a non-depleted portion of the p-type gate layer 34 (i.e., a portion of the p-type gate layer 34 located below the depletion layer 42) by the depletion layer 42. For this reason, while the gate-on voltage Vg1 is being applied, the flow of a current between the gate electrode 36 and another electrode (e.g., the source electrode 30 or the drain electrode 32) via the p-type gate layer 34 is suppressed. That is, a gate-leakage current is suppressed.

The following will describe an operation for turning off the HEMT 10. When the HEMT 10 is turned off, the gate voltage is lowered from the gate-on voltage Vg1 to the gate-off voltage Vg0. As mentioned above, in the state where the HEMT 10 is on, the gate electrode 36 is electrically isolated from the p-type gate layer 34 by the depletion layer 42. For this reason, a potential of the portion of the p-type gate layer 34 located below the depletion layer 42 is floating. Therefore, even when the gate voltage is lowered to the gate-off voltage Vg0, the potential of the p-type gate layer 34 does not drop immediately. On the other hand, when the gate voltage is lowered to the gate-off voltage Vg0, the applied voltage (reverse voltage) to the Schottky interfaces 37a becomes smaller, so that the depletion layer 42 shrinks toward the Schottky interfaces 37a. As shown in FIG. 5, when the depletion layer 42 shrinks by a certain extent, the depletion layer 42 is separated below the ohmic electrode portion 38 into two sides, and the gate electrode 36 is connected to the p-type gate layer 34 via the ohmic interface 38a. This causes the potential of the p-type gate layer 34 to start to drop. That is, before the depletion layer 42 disappears, the gate electrode 36 is connected to the p-type gate layer 34, and the potential of the p-type gate layer 34 starts to drop. After that, as the potential of the p-type gate layer 34 drops, the depletion layer 40 extends from the p-type gate layer 34 to the portion of the electron supply layer 18 located below the p-type gate layer 34. When the potential of the p-type gate layer 34 drops to a predetermined potential, the depletion layer 40 reaches the hetero junction 18a as shown in FIG. 3, so that the HEMT 10 is turned off. Further, when the potential of the p-type gate layer 34 drops to the predetermined potential, the depletion layer 42 disappears as shown in FIG. 3.

As described above, when the HEMT 10 according to Embodiment 1 is on, the gate electrode 36 is electrically isolated by the depletion layer 42 from the portion of the p-type gate layer 34 located below the depletion layer 42. This causes a gate-leakage current to be suppressed. Further, when the HEMT 10 according to Embodiment 1 is turned off, the depletion layer 42 shrinks toward the Schottky interfaces 37a; therefore, the depletion layer 42 retreats from the lower part of the ohmic electrode portion 38 at a stage earlier than the disappearance of the entire depletion layer 42. For this reason, as shown in FIG. 5, at a stage where the comparatively thick depletion layer 42 remains in the p-type gate layer 34, the gate electrode 36 is electrically connected to the p-type gate layer 34, and the potential of the p-type gate layer 34 starts to drop. That is, in this HEMT 10, the potential of the p-type gate layer 34 starts to drop at an earlier timing in the HEMT 10 than it does in a conventional HEMT that suppresses a gate-leakage current (e.g., the HEMT of Japanese Patent Application Publication No. 2013-80894 A). For this reason, the HEMT 10 according to Embodiment 1 has a high response speed when it is turned off. Thus, the structure of Embodiment 1 makes it possible to provide a normally-off HEMT that is capable of suppressing a gate-leakage current and that has a high response speed when it is turned off.

In Embodiment 1 described above, the ohmic interface 38a is provided within a range of the distance L2 from the Schottky interfaces 37a. For this reason, in a state where the gate voltage is higher than the gate threshold voltage Vgth, the gate electrode 36 is electrically isolated from the p-type gate layer 34 by the depletion layer 42 so that a gate-leakage current can be surely suppressed. Alternatively, the ohmic interface 38a may be provided in a position away from the Schottky interfaces 37a by a distance that is longer the distance L2. For example, the ohmic interface 38a may be provided within a range of the distance L1 (i.e., the distance that is longer than the distance L2) from the Schottky interfaces 37a which satisfies the formula:

$$L1 = \sqrt{\frac{2\varepsilon_s(Vbi + Vgm)}{qNa}}$$

Figure 6:
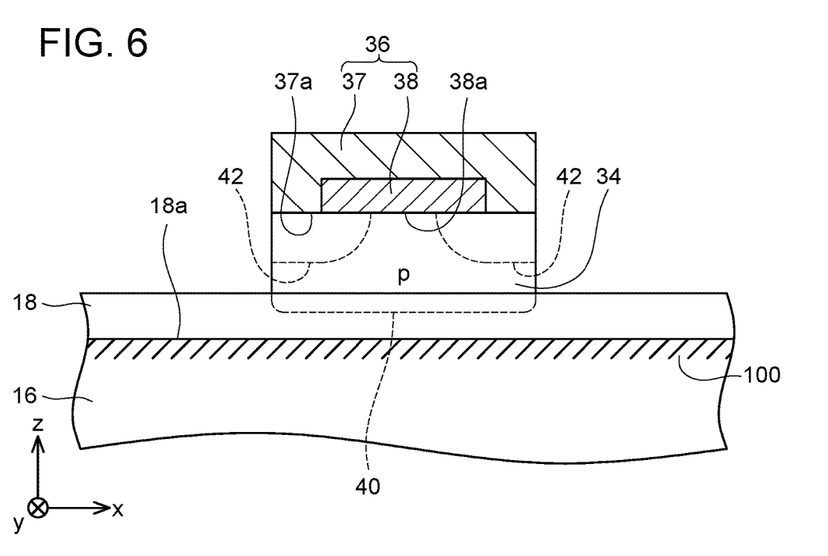
FIG. 6 is an enlarged cross-sectional view of a gate and an area therearound of a HEMT according to a first modification.

It should be noted that the voltage Vgm (V) is a rated gate voltage of the HEMT. The rated gate voltage is the largest one of the values that the gate voltage of the HEMT can take on, and is a value defined by the provider (manufacturer, seller, or the like) of the HEMT. With such a configuration, when the rated gate voltage Vgm is applied, the gate electrode 36 is electrically isolated from the p-type gate layer 34 by the depletion layer 42. This makes it possible to more effectively suppress a gate-leakage current when the rated gate voltage, is applied. Alternatively, the ohmic interface 38a may be provided in a position away from the Schottky interfaces 37a by a distance that is longer than the distance L1. In this case, as shown in FIG. 6, even when the gate voltage is applied, the depletion layer 42 is not formed in a part of the region below the ohmic electrode portion 38, and the gate electrode 36 is connected to the p-type gate layer 34 via the portion in which the depletion layer 42 is not provided. However, even such an aspect, too, makes it possible to suppress a gate-leakage current to a certain extent, as the width of the portion via which the ohmic electrode 38 is connected to the p-type gate layer 34 is narrowed by the depletion layer 42.

Figure 7:
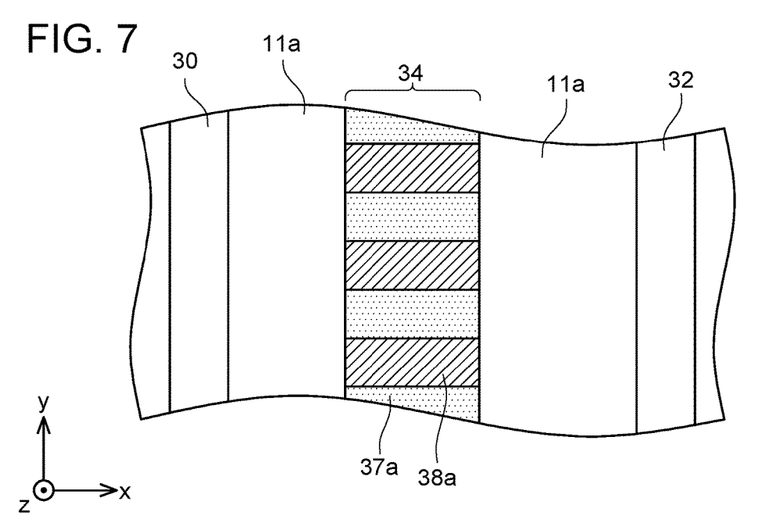
FIG. 7 is a plan view of an HEMT 10 according to a second modification (but omits to illustrate a gate electrode 36 and shows an arrangement of interfaces 37a and 38a)
Figure 8:
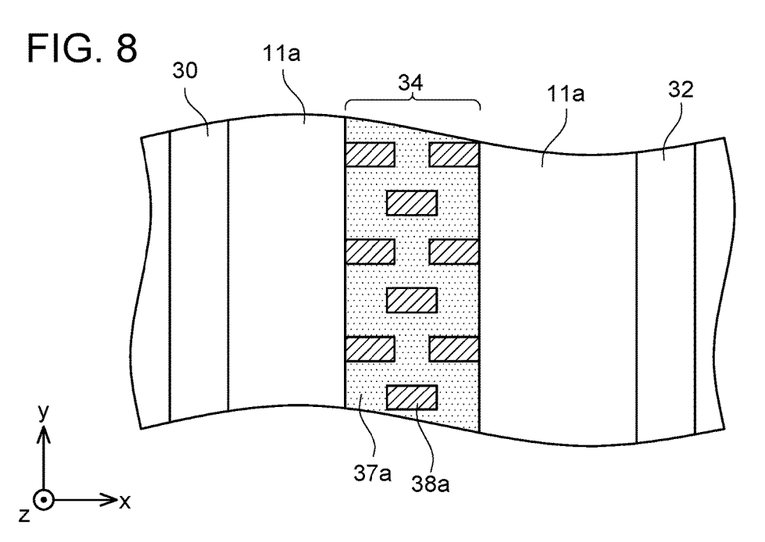
FIG. 8 is a plan view of the HEMT 10 according to a third modification (but omits to illustrate a gate electrode 36 and shows an arrangement of interfaces 37a and 38a)

In the HEMT 10 according to Embodiment 1, as shown in FIG. 2, the ohmic interface 38a and the Schottky interfaces 37a extend in the form of stripes in the y direction. Alternatively, the ohmic interface 38a and the Schottky interfaces 37a may be arranged in any way on the front surface of the p-type gate layer 34. For example, as shown in FIG. 7, ohmic interfaces 38a and Schottky interfaces 37a may extend in the form of stripes in the x direction. Alternatively, for example, as shown in FIG. 8, a plurality of ohmic interfaces 38a may be dispersedly arranged on the front surface of the p-type gate layer 34.

Embodiment 2

Figure 9:
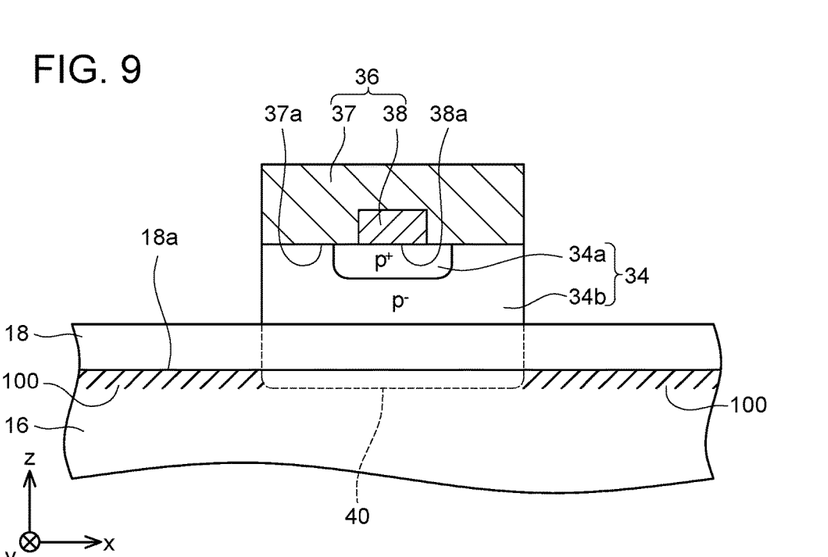
FIG. 9 is an enlarged cross-sectional view of a gate and an area therearound of a HEMT according to Embodiment 2.

In a HEMT according to Embodiment 2 shown in FIG. 9, the p-type gate layer 34 includes a high density region 34a and a low density region 34b. The other components of the HEMT according to Embodiment 2 are identical to those of the HEMT according to Embodiment 1. The low density region 34b has a low p-type impurity density, and the high density region 34a has a p-type impurity density higher than the p-type impurity density of the low density region 34b. The high density region 34a is exposed at the center of the front surface of the p-type gate layer 34, and is in contact with the ohmic electrode portion 38 and the Schottky electrode portion 37. The low density region 34b is in contact with the Schottky electrode portion 37 at both sides of the high density region 34a. Further, the low density region 34b is provided in the whole area of the p-type gate layer 34 on an electron supply layer 18 side. The low density region 34b is in contact with the electron supply layer 18. The high density region 34a is out of contact with the electron supply layer 18.

Figure 10:
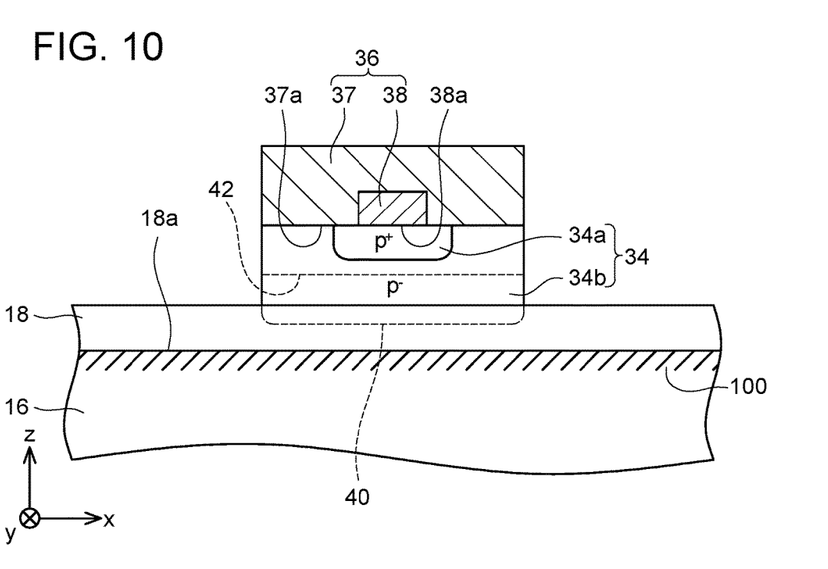
FIG. 10 is an enlarged cross-sectional view of the gate and the area therearound of the HEMT according to Embodiment 2.

In the HEMT according to Embodiment 2, in the state where the gate-off voltage Vg0 is being applied as the gate voltage, the depletion layer 40 extends to the hetero junction 18a as shown in FIG. 9. Therefore, the HEMT is off. When the gate-on voltage Vg1 is applied as the gate voltage, the depletion layer 40 retreats from the hetero junction 18a as shown in FIG. 10, so that the HEMT is turned on. Further, when the gate-on voltage Vg1 is applied, the depletion layer 42 extends from the Schottky interface 37a to the low density region 34b. Since the high density region 34a has a high p-type impurity density, the depletion layer 42 hardly spreads to the high density region 34a. As shown in FIG. 10, when the gate-on voltage Vg1 is applied, whole region surrounding the high density region 34a is covered by the depletion layer 42 extending from the Schottky interface 37a into the low density region 34b (that is, the high density region 34a is provided within a range of the aforementioned distance L1 from one of the Schottky interfaces 37a between the low density region 34b and the p-type gate layer 34). This causes the gate electrode 36 to be electrically isolated by the depletion layer 42 from a portion of the p-type gate layer 34 located below the depletion layer 42. Therefore, the HEMT according to Embodiment 2, too, suppresses a gate-leakage current.

Figure 11:
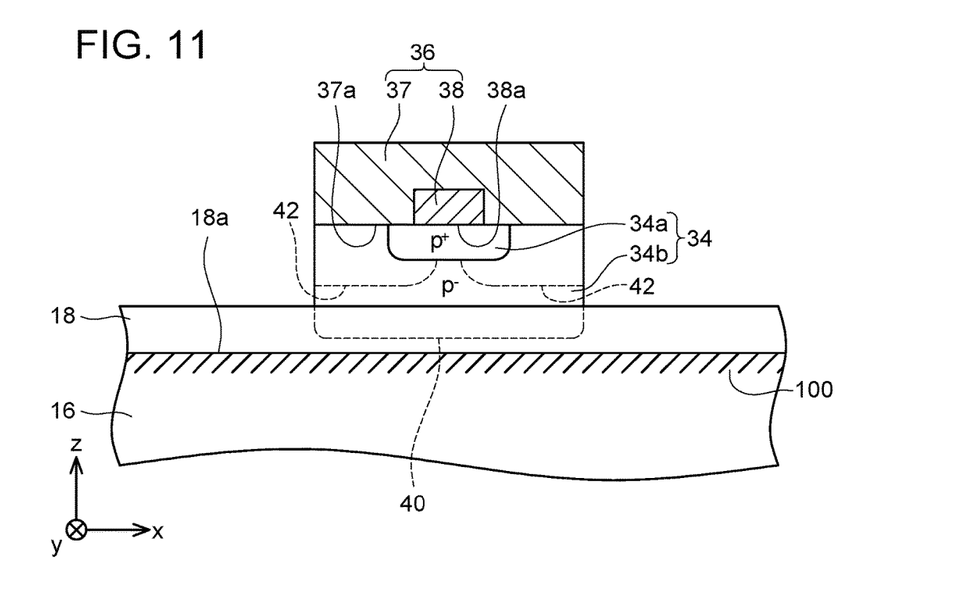
FIG. 11 is an enlarged cross-sectional view of the gate and the area therearound of the HEMT according to Embodiment 2.

After that, when the gate voltage is lowered to the gate-off voltage Vg0, the depletion layer 42 shrinks toward the Schottky interface 37a as shown in FIG. 11. This causes the depletion layer 42 to be separated into two sides below the high density region 34a. This causes the gate electrode 36 to be electrically connected to the low density region 34b via the high density region 34a. Since the gate electrode 36 is in contact with the high density region 34a, the contact resistance between the gate electrode 36 and the p-type gate layer 34 is small. For this reason, when the gate electrode 36 is electrically connected to the low density region 34b, a potential of the low density region 34b rapidly drops to the gate-off voltage Vg0. This causes the depletion layer 40 to extend from the low density region 34b toward the hetero junction 18a, thus causing the HEMT to be turned off. Thus, in the HEMT according to Embodiment 2, the contact resistance between the gate electrode 36 and the p-type gate layer 34 is decreased by the high density region 34a. Therefore, the HEMT has a higher response speed when it is turned off.

Embodiment 3

Figure 12:
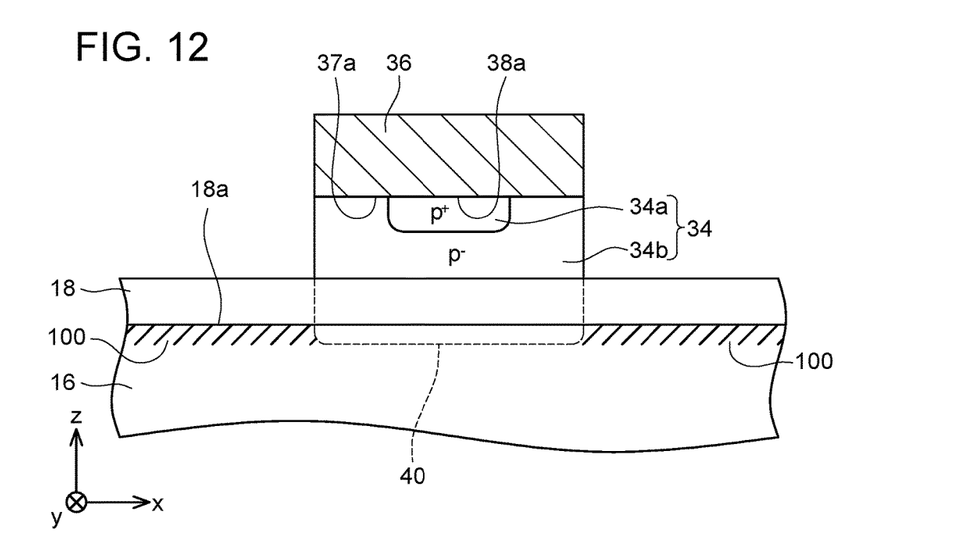
FIG. 12 is an enlarged cross-sectional view of a gate and an area therearound of an HEMT according to Embodiment 3.

In a HEMT according to Embodiment 3 shown in FIG. 12, as in the HEMT according to Embodiment 2, the p-type gate layer 34 includes a high density region 34a and a low density region 34b. In the HEMT according to Embodiment 3, unlike in the HEMT according to Embodiment 2, the gate electrode 36 is made of a single metal (e.g., Pb, Ni, W, or an alloy thereat). The gate electrode 36 is in contact with both the high density region 34a and the low density region 34b. The other components of the HEMT according to Embodiment 3 are identical to those of the HEMT 10 according to Embodiment 1.

In the HEMT according to Embodiment 3, the ohmic interface 38a is provided at an interface between the gate electrode 36 and the high density region 34a, and the Schottky interface 37a is provided at an interface between the gate electrode 36 and the low density region 34b. By thus providing the high density region 34a and the low density region 34b within a portion of the p-type gate layer 34 that is in contact with the gate electrode 36, the ohmic interface 38a and the Schottky interface 37a can be provided with respect to the gate electrode 36, which is made of a single metal. The structure of Embodiment 3, too, makes it possible to provide a normally-off HEMT that is capable of suppressing a gate-leakage current and that has a high response speed when it is turned off.

Embodiment 4

Figure 13:
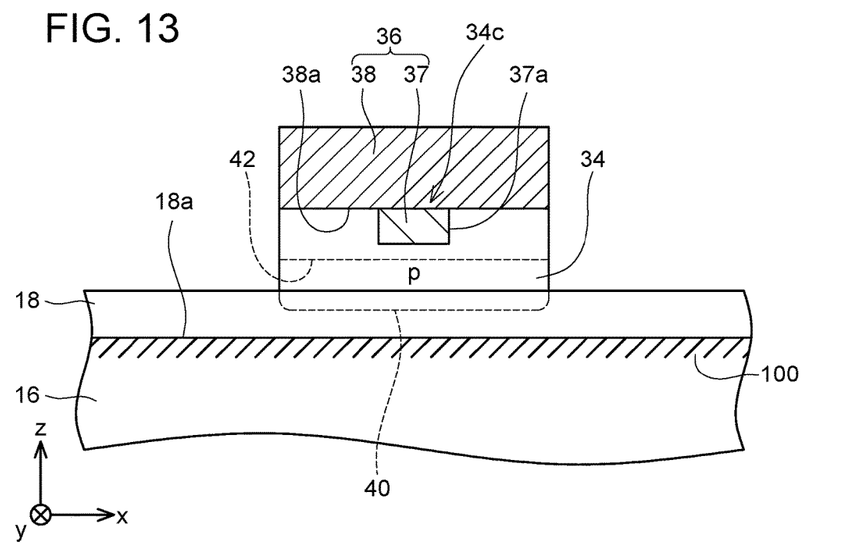
FIG. 13 is an enlarged cross-sectional view of a gate and an area therearound of an HEMT according to Embodiment 4.

In a HEMT according to Embodiment 4 shown in FIG. 13, the p-type gate layer 34 has a depressed portion 34c provided in the center of the front surface of the p-type gate layer 34, and in the depressed portion 34c, the Schottky electrode portion 37 is embedded. The Schottky electrode portion 37 is in Schottky contact with the p-type gate layer 34 at an inner surface of the depressed portion 34c. Further, the ohmic electrode portion 38 is provided on the front surface of the p-type gate layer 34 and the front surface of the Schottky electrode portion 37. The ohmic electrode portion 38 is in ohmic contact with the p-type gate layer 34. Further, the ohmic electrode portion 38 is in contact with the Schottky electrode portion 37.

In the HEMT according to Embodiment 4, too, when the gate-on voltage Vg1 is applied as the gate voltage, the depletion layer 40 retreats from the hetero junction 18a, so that the HEMT is turned on. Further, when the gate-on voltage Vg1 is applied, the depletion layer 42 extends from the Schottky interface 37a (i.e., the inner surface of the depressed portion 34c) into the p-type gate layer 34. In the HEMT according to Embodiment 4, the Schottky interface 37a has a wide area, as the Schottky electrode portion 37 is embedded in the p-type gate layer 34. For this reason, the depletion layer 42 extends over a wider area in the p-type gate layer 34. The gate electrode 36 is electrically isolated by the depletion layer 42 from the portion of the p-type gate layer 34 located below the depletion layer 42. For this reason, a gate-leakage current is suppressed. After that, when the gate voltage is lowered to the gate-off voltage Vg0, the depletion layer 42 shrinks toward the Schottky interface 37a. When this causes the depletion layer 42 to retreat from the tower part of the ohmic interface 38a, the potential of the p-type gate layer 34 drops, so that the HEMT is turned off. The structure of Embodiment 4, too, makes it possible to provide a normally-off HEMT that is capable of suppressing a gate-leakage current and that has a high response speed when it is turned off.

Embodiment 5

Figure 14:
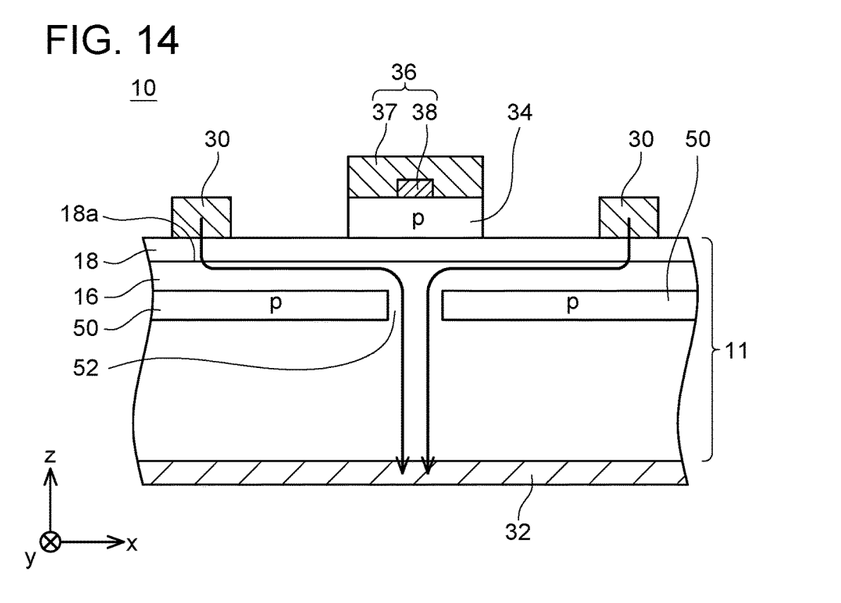
FIG. 14 is a longitudinal sectional view of a HEMT according to Embodiment 5.

A HEMT according to Embodiment 5 shown in FIG. 14 is a vertical type HEMT. The electron supply layer 18, the p-type gate layer 34, and the gate electrode 36 of the HEMT according to Embodiment 5 are configured in the same manner as those of Embodiment 1.

The HEMT according to Embodiment 5 includes two source electrodes 30 located on the front surface of the electron supply layer 18 (i.e., on the surface of the electron supply layer 18 opposite from the electron transit layer 16). Further, the electron transit layer 16 spreads to a rear surface of the multilayer substrate 11. The drain electrode 32 is located on the rear surface of the multilayer substrate 11 (i.e., a rear surface of the electron transit layer 16), and is in contact with the electron transit layer 16. Further, a p-type separation region 50 is provided inside the electron transit layer 16. The p-type separation region 50 is located at an intermediate depth in the electron transit layer 16, and is out of contact with the electron supply layer 18 and the drain electrode 32. The p-type separation region 50 separates the electron transit layer 16 into upper and lower parts. The p-type separation region 50 has an interval portion in which the p-type separation region 50 is not provided, and in the interval portion, a connection portion 52 is provided. The connection portion 52 is a part of the electron transit layer 16. The connection portion 52 connects a portion of the electron transit layer 16 located above the p-type separation region 50 and a portion of the electron transit layer 16 located below the p-type separation region 50. The p-type gate layer 34 is located above the connection portion 52. Each of the source electrodes 30 is located above the p-type separation region 50.

In the HEMT according to Embodiment 5, in a state were the gate-off voltage Vg0 is being applied, a portion of the hetero junction 18a located above the connection portion 52 is depleted by the depletion layer extending downward from the p-type gate layer 34. For this reason, the HEMT is off. Raising the gate voltage from the gate-off voltage Vg0 to the gate-on voltage Vg1 causes the depletion layer to retreat from the portion of the hetero junction 18a located above the connection portion 52, thus causing a 2DEG to be formed all over the hetero junction 18a. This causes electrons to flow from the source electrodes 30 toward the drain electrode 32 as indicated by the arrows in FIG. 14. That is, the HEMT is turned on. The HEMT according to Embodiment 5, too, has the same gate structure (i.e., the structure of the gate electrode 36 and the p-type gate layer 34) as the Embodiment 1. Therefore, the structure of Embodiment 5, too, makes it possible to provide a normally-off HEMT that is capable of suppressing a gate-leakage current and that has a high response speed when it is turned off.

It should be noted that the vertical type HEMT according to Embodiment 5 may employ the gate structure of Embodiments 2 to 4.

Further, in the HEMTs of Embodiments 2 to 5, too, it is preferable that the ohmic interface 38a be provided in a range of the distance L1 from the Schottky interface 37a, and it is more preferable that the ohmic interface 38a be provided in a range of the distance L2 from the Schottky interface 37a.

Further, in the HEMTs of Embodiments 2 to 5, too, the ohmic interface 38a and the Schottky interface 37a can be freely arranged. For example, an arrangement such as those shown in FIGS. 2, 7, and 8 may be employed.

Embodiment 6

Figure 15:
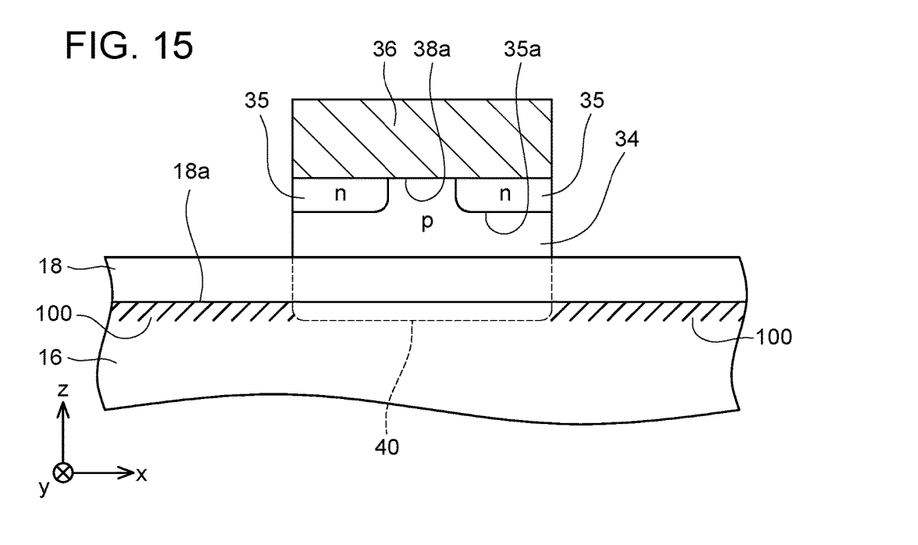
FIG. 15 is an enlarged cross-sectional view of a gate and an area therearound of an HEMT according to Embodiment 6.

A HEMT according to Embodiment 6 shown in FIG. 15 includes n-type gate layers 35 provided as a part of the surface layer portion of the p-type gate layer 34. The p-type gate layer 34 is in contact with the gate electrode 36 in the center of the p-type gate layer 34 in the x direction. Such n-type gate layers 35 are provided at both sides (both sides in the x direction), respectively, of an area in which the p-type gate layer 34 is in contact with the gate electrode 36. A p-n junction 35a is provided at an interface between the p-type gate layer 34 and each of these n-type gate layers 35. Further, the p-type gate layer 34 and each of these n-type gate layers 35 are in ohmic contact with the gate electrode 36.

Figure 16:
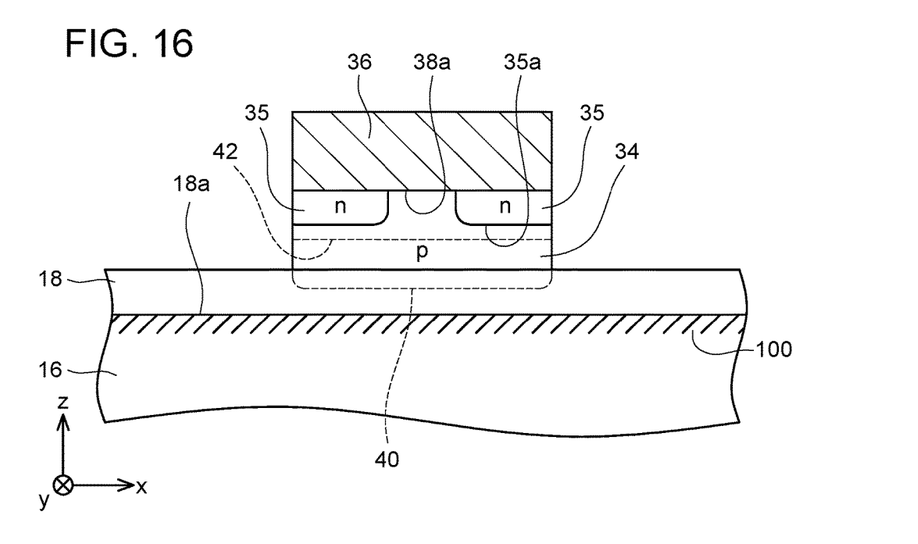
FIG. 16 is an enlarged cross-sectional view of the gate and the area therearound of the HEMT according to Embodiment 6.

In the HEMT according to Embodiment 6, in a state where the gate-off voltage Vg0 is applied as the gate voltage, the depletion layer 40 extends to the hetero junction 18a as shown in FIG. 15. Therefore, the HEMT is off. When the gate-on voltage Vg1 is applied as the gate voltage, the depletion layer 40 retreats from the hetero junction 18a as shown in FIG. 16, so that the HEMT is turned on. Further, when the gate-on voltage is applied, the depletion layer 42 extends from the p-n junction 35a to the p-type gate layer 34. As shown in FIG. 16, the depletion layer 42, which extends from the p-n junction 35a, extends to cover the ohmic interface 38a between the p-type gate layer 34 and the gate electrode 36. This causes the gate electrode 36 to be electrically isolated by the depletion layer 42 from the portion of the p-type gate layer 34 located below the depletion layer 42. Therefore, the HEMT according to Embodiment 6, too, suppresses a gate-leakage current.

Figure 17:
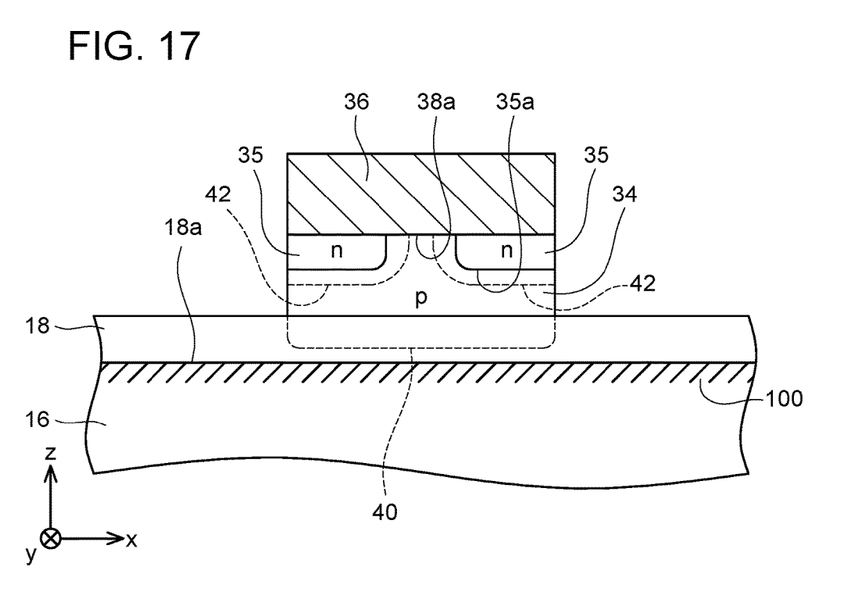
FIG. 17 is an enlarged cross-sectional view of the gate and the area therearound of the HEMT according to Embodiment 6.

After that, when the gate voltage is lowered to the gate-off voltage Vg0, the depletion layer 42 shrinks toward the p-n junction 35a as shown in FIG. 17. This causes the depletion layer 42 to be separated into two sides below the ohmic interface 38a. This causes the gate electrode 36 to be connected to the p-type gate layer 34. Therefore, the potential of the p-type gate layer 34 rapidly drops to the gate-off voltage Vg0. This causes the depletion layer 40 to extend from the p-type gate layer 34 toward the hetero junction 18a, thus causing the HEMT to be turned off. Thus, the structure of Embodiment 6, too, makes it possible to provide a normally-off HEMT that is capable of suppressing a gate-leakage current and that has a high response speed when it is turned off.

It should be noted that the gate structure of Embodiment 6 may be applied to a vertical type HEMT. Further, in Embodiment 6, the p-n junction 35a and the ohmic interface 38a can be freely arranged. For example, an arrangement such as those shown in FIGS. 2, 7, and 8 may be employed.

Relationships between the components of the embodiments described above and the components of the claims are described. The electron transit layer 16 of Embodiments 1 to 6 is an example of the claimed first nitride semiconductor layer. The electron supply layer 18 of Embodiments 1 to 6 is an example of the claimed second nitride semiconductor layer. The p-type gate layer 34 of Embodiments 1 to 6 is an example of the claimed p-type semiconductor layer. The ohmic interface 38a of Embodiments 1 to 6 is an example of the claimed first interface. The Schottky interface 37a of Embodiments 1 to 5 is an example of the claimed second interface. The p-n junction 35a of Embodiment 6 is an example of the claimed second interface.

Technical elements disclosed herein are enumerated below. It should be noted that the following technical elements are each independently useful.

In a nitride semiconductor device disclosed herein as an example, the gate electrode may be in ohmic contact with the p-type semiconductor layer at the first interface, and the gate electrode may be in Schottky contact with the p-type semiconductor layer at the second interface.

With this configuration, when the gate voltage is high, a depletion layer spreads from the second interface (Schottky interface) to the p-type semiconductor layer, so that a gate-leakage current is suppressed. Further, when the gate voltage is lowered, the gate electrode is electrically connected to the p-type semiconductor layer via the first interface (ohmic interface), so that a potential of the p-type semiconductor layer quickly drops. Therefore, this nitride semiconductor device has a high response speed when it is turned off.

In a nitride semiconductor device disclosed herein as an example, the first interface and the second interface may be adjacent to each other.

This configuration makes it easy for the depletion layer, which extends from the second interface, to extend to a rear side of the first interface. This makes it possible to more effectively suppress a gate-leakage current.

In a nitride semiconductor device disclosed herein as an example, the first interface may be provided within a range of a distance L1(m) from the second interface. The distance L1, a dielectric constant $\varepsilon_s$ (Fm−1) of the p-type semiconductor layer, a built-in potential Vbi (V) of the second interface, a maximum rated gate voltage Vgm (V), an elementary electric charge q (C), and a p-type impurity density Na (m−3) in the p-type semiconductor layer satisfy the formula:

$$L1 = \sqrt{\frac{2\varepsilon_s(Vbi+Vgm)}{qNa}},$$

The maximum rated gate voltage means a maximum voltage available for the nitride semiconductor device as a gate voltage and is decided by a provider such as a manufacturer or a seller of the nitride semiconductor device. A maximum rated gate voltage for a general nitride semiconductor device is 5 to 25 V.

With this configuration, when the maximum rated gate voltage is applied, the depletion layer, which spreads from the second interface, depletes the whole area of the rear side of the first interface. This makes it possible to more effectively suppress a gate-leakage current.

In a nitride semiconductor device disclosed herein as an example, the first interface may be provided within a range of a distance L2(m) from the second interface. The distance L2, the dielectric constant $\varepsilon_s$, the built-in potential Vbi, the elementary electric charge q, the p-type impurity density Na, and a gate threshold voltage Vgth (V) satisfy the formula:

$$L2 = \sqrt{\frac{2\varepsilon_s(Vbi+Vgth)}{qNa}},$$

The gate threshold voltage means a minimum gate voltage necessary for turning the nitride semiconductor device on. A gate threshold voltage for a general nitride semiconductor device is 2 to 4 V.

With this configuration, when a gate voltage that is equal to or higher than the gate threshold voltage is applied, the depletion layer, which spreads from the second interface, depletes the whole area of the rear side of the first interface. This makes it possible to more effectively suppress a gate-leakage current.

In a nitride semiconductor device disclosed herein as an example, the gate electrode may include an embedded portion embedded in the p-type semiconductor layer. The second interface may be provided at an interface between the embedded portion and the p-type semiconductor layer.

This configuration enables to make the area of the second interface wider. This allows the depletion layer to extend over a wider area in the p-type semiconductor layer.

In a nitride semiconductor device disclosed herein as an example, the p-type semiconductor layer may comprise a low density region and a high density region having a p-type impurity density higher than a p-type impurity density of the low density region. The gate electrode may be in contact with the low density region and the high density region. The first interface may be provided at an interface between the high density region and the gate electrode. The second interface may be provided at an interface between the low density region and the gate electrode.

This configuration makes it possible to decrease the contact resistance between the gate electrode and the p-type semiconductor layer at the first interface. This allows the nitride semiconductor device to have a higher response speed when it is turned off.

In the nitride semiconductor device comprising the low density region and the high density region, a portion of the gate electrode being in contact with the p-type semiconductor layer via the first interface and a portion of the gate electrode being in contact with the p-type semiconductor layer via the second interface may be made of a common metal.

Making a difference in p-type impurity density of in the p-type semiconductor layer makes it possible to provide a Schottky interface and an ohmic interface with respect to the common metal.

In a nitride semiconductor device disclosed herein as an example, the nitride semiconductor device may further comprise an n-type semiconductor layer being in contact with the p-type semiconductor layer and separated from the second nitride semiconductor layer by the p-type semiconductor layer. The gate electrode may be in contact with the p-type semiconductor layer and the n-type semiconductor layer. The first interface may be provided at an interface between the gate electrode and the p-type semiconductor layer. The second interface may be provided at an interface between the n-type semiconductor layer and the p-type semiconductor layer.

With this configuration, when the gate voltage is high, a depletion layer spreads from the second interface (p-n junction) to the p-type semiconductor layer, so that a gate-leakage current is suppressed. Further, when the gate voltage is lowered, the gate electrode is electrically connected to the p-type semiconductor layer via the first interface, so that a potential of the p-type semiconductor layer quickly drops. Therefore, this nitride semiconductor device has a high response speed when it is turned off.

In a nitride semiconductor device disclosed herein as an example, the nitride semiconductor device may further comprise: a source electrode located on the second nitride semiconductor layer, and a drain electrode located on the second nitride semiconductor layer. The p-type semiconductor layer may be located between the source electrode and the drain electrode.

This configuration makes it possible to achieve a horizontal type nitride semiconductor device.

In a nitride semiconductor device disclosed herein as an example, the nitride semiconductor device may further comprises: a source electrode located on a front surface of the second nitride semiconductor layer, a drain electrode located on a rear surface of the first nitride semiconductor layer, and a p-type separation region located inside the first nitride semiconductor layer. The first nitride semiconductor layer may comprises: a first portion located on a front surface side of the p-type separation region; a second portion located on a rear surface side of the p-type separation region; and a connection portion connecting the first portion and the second portion. The source electrode may be located at a position on the front surface side of the p-type separation region. The p-type semiconductor layer may be located at a position on the front surface side of the connection portion.

This configuration makes it possible to achieve a vertical type nitride semiconductor device.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:
1. A nitride semiconductor switching device, comprising:
a first nitride semiconductor layer;
a second nitride semiconductor layer located on and being in direct contact with the first nitride semiconductor layer and having a band gap larger than a band gap of the first nitride semiconductor layer;
a p-type semiconductor layer protruding from and being in direct contact with the second nitride semiconductor layer; and
a gate electrode located on and being in direct contact with the p-type semiconductor layer, the gate electrode comprising a first portion and a second portion, the first portion comprising a first material that is different from a second material of the second portion and wherein the first portion is partially surrounded by the second portion,
wherein
a first interface and a second interface are located in parallel between the gate electrode and the p-type semiconductor layer,
the first portion is in ohmic contact with the p-type semiconductor layer at the first interface, and
the second portion is in Schottky contact with the p-type semiconductor layer at the second interface and at least one side wall of the second portion is aligned with at least one side wall of the p-type semiconductor layer.
2. The nitride semiconductor switching device of claim 1, wherein the first interface and the second interface are adjacent to each other.
3. The nitride semiconductor switching device of claim 2, wherein
the first interface is provided within a range of a distance L1 (m) from the second interface,
the distance L1, a dielectric constant $\epsilon_s$ (Fm$^{-1}$) of the p-type semiconductor layer, a built-in potential Vbi (V) of the second interface, a maximum rated gate voltage Vgm (V), an elementary electric charge q (C), and a p-type impurity density Na (m$^{-3}$) in the p-type semiconductor layer satisfy the formula:

$$L1 = \sqrt{\frac{2\epsilon_s(Vbi+Vgm)}{qNa}}.$$

4. The nitride semiconductor switching device of claim 3, wherein
the first interface is provided within a range of a distance L2 (m) from the second interface,
the distance L2, the dielectric constant $\epsilon_s$, the built-in potential Vbi, the elementary electric charge q, the p-type impurity density Na, and a gate threshold voltage Vgth (V) satisfy the formula:

$$L2 = \sqrt{\frac{2\epsilon_s(Vbi+Vgth)}{qNa}}.$$

5. The nitride semiconductor switching device of claim 1, wherein
   the p-type semiconductor layer comprises a low density region and a high density region having a p-type impurity density higher than a p-type impurity density of the low density region,
   the gate electrode is in contact with the low density region and the high density region,
   the first interface is provided at an interface between the high density region and the gate electrode, and
   the second interface is provided at an interface between the low density region and the gate electrode.

6. The nitride semiconductor switching device of claim 1, further comprising:
   a source electrode located on the second nitride semiconductor layer, and
   a drain electrode located on the second nitride semiconductor layer,
   wherein
   the p-type semiconductor layer is located between the source electrode and the drain electrode.

7. The nitride semiconductor switching device of claim 1, further comprising:
   a source electrode located on a front surface of the second nitride semiconductor layer,
   a drain electrode located on a rear surface of the first nitride semiconductor layer, and
   a p-type separation region located inside the first nitride semiconductor layer,
   wherein
   the first nitride semiconductor layer comprises:
   a first portion located on a front surface side of the p-type separation region;
   a second portion located on a rear surface side of the p-type separation region; and
   a connection portion connecting the first portion and the second portion,
   the source electrode is located at a position on the front surface side of the p-type separation region, and
   the p-type semiconductor layer is located at a position on the front surface side of the connection portion.

* * * * *